(12) United States Patent
Foote

(10) Patent No.: US 6,662,658 B2
(45) Date of Patent: Dec. 16, 2003

(54) WHIFFLETREE ACCELEROMETER

(75) Inventor: Steven A. Foote, Issaquah, WA (US)

(73) Assignee: Honeywell International, Inc., Morristown, NJ (US)

(*) Notice: Subject to any disclaimer, the term of this patent is extended or adjusted under 35 U.S.C. 154(b) by 36 days.

(21) Appl. No.: 10/052,713

(22) Filed: Jan. 17, 2002

(65) Prior Publication Data

US 2002/0092352 A1 Jul. 18, 2002

Related U.S. Application Data

(60) Provisional application No. 60/262,473, filed on Jan. 17, 2001.

(51) Int. Cl.[7] .................................. G01P 15/10
(52) U.S. Cl. ......................... 73/514.29; 73/514.36
(58) Field of Search .................. 73/504.03, 504.12, 73/504.16, 510, 514.29, 514.34, 514.36, 514.37, 514.38, 862.59

(56) References Cited

U.S. PATENT DOCUMENTS

| | | | |
|---|---|---|---|
| 4,879,914 A | * 11/1989 | Norling | 73/862.59 |
| 5,005,413 A | * 4/1991 | Novack et al. | 73/514.29 |
| 5,456,110 A | * 10/1995 | Hulsing, II | 73/514.38 |
| 5,594,170 A | 1/1997 | Peters | |
| 5,948,982 A | * 9/1999 | Woodruff et al. | 73/514.29 |
| 6,282,959 B1 | * 9/2001 | Blake et al. | 73/514.29 |

FOREIGN PATENT DOCUMENTS

EP 0 507 338 A1 10/1992

* cited by examiner

Primary Examiner—Helen Kwok
(74) Attorney, Agent, or Firm—Charles J. Rupnick

(57) ABSTRACT

An apparatus and method for suspending two or more force-versus-displacement sensors for measuring displacement of a pendular structure relative to a frame structure, wherein a suspension structure includes the frame and pendular structures, the pendular structure having a base structure suspended from the frame structure for rotation about a first axis, a beam structure spaced away from the first axis, and a flexure suspending the beam structure from the base structure for rotation about a second axis that is substantially perpendicular to the first axis. The flexure suspending the beam structure from the base structure is positioned substantially intermediate between suspension positions of the force-versus-displacement sensors, and constrains the beam structure to motion substantially within the plane of the pendular structure.

20 Claims, 3 Drawing Sheets

WHIFFLETREE ACCELEROMETER

This application claims the benefit of U.S. Provisional Application Ser. No. 60/262,473, filed in the name of Steven A. Foote on Jan. 17, 2001, the complete disclosure of which is incorporated herein by reference.

FIELD OF THE INVENTION

The present invention relates to suspension devices and methods, and in particular to structures for mounting force-versus-displacement sensors, whereby external stress sources are isolated from active sensor components.

BACKGROUND OF THE INVENTION

Accelerometers generally measure acceleration forces applied to a body by being mounted directly onto a surface of the accelerated body. One common type of accelerometer employs one or more force-versus-displacement or "force/displacement" sensors for measurement of acceleration. Accelerometers employing two force/displacement sensors instead of the necessary minimum one sensor gain considerable advantage. If the two sensors operate in a push-pull mode, then many error sources such as thermally driven effects or drift may be rejected as common mode, while the difference signal represents the desired acceleration measurement. Occasionally, designs using two force/displacement sensors include two completely separate proof masses, which results in essentially two accelerometers, each having its own sensor, but operating in opposite directions. For numerous reasons, however, a two proof mass solution is not preferred. Rather, it is generally advantageous to have only one proof mass in an accelerometer. This preference for a single proof mass with two force/displacement sensors operating in a push-pull mode leads to an over-constrained system that results in considerable inherent errors.

A typical example of a prior art two sensor/single proof mass accelerometer, commonly referred to as a Tee design, is illustrated in FIGS. 1A and 1B. The accelerometer 10 illustrated in FIGS. 1A and 1B is a miniature structure fabricated from a substrate 12 of semiconductor material by conventional micromachining techniques. The substrate 12 is formed of a monocrystalline silicon material in a substantially planar structure, i.e., having substantially planar and parallel opposing offset upper and lower surfaces. The silicon substrate 12 often includes an upper silicon or active layer 14 that is electrically isolated from an underlying substrate 16 by an insulating layer 18, or an insulating layer is applied to active layer 14, as shown and described in U.S. Pat. No. 5,948,981, the entirety of which is incorporated herein by reference. The insulating layer 18 is may be a thin layer, e.g., about 0.1 to 10.0 micrometers, of an oxide, such as silicon oxide. The silicon substrate 12 is usually formed by oxidizing active layer 14 and underlying substrate 16, and adhering the two layers together. A portion of active layer 14 may be removed to bring the layer 14 to the desired thickness. The silicon oxide layer 18 retains its insulating properties over a wide temperature range to ensure effective mechanical resonator performance at high operating temperatures on the order of 100 degrees Celsius. In addition, the insulating layer 18 inhibits undesirable etching of the active layer 14 during manufacturing.

The accelerometer 10 includes an acceleration sensor mechanism 20 having one or more flexures 22 pliantly suspending a proof mass 24 from an inner sensor frame or plate 26 for movement of the proof mass 24 along an input axis I normal to the proof mass 24. The flexures 22 are preferably etched near or at the center of the underlying substrate 16, i.e., substantially centered between the opposing upper and lower surfaces of the underlying substrate 16. Optionally, the flexures 22 are formed by anistropically etching in a suitable etchant, such as potassium hydroxide (KOH). The flexures 22 define a hinge axis H about which the proof mass 24 moves in response to an applied force, such as the acceleration of the accelerated body, for example, a vehicle, aircraft or other moving body having the accelerometer 10 mounted thereon. The sensor mechanism 20 includes a pair of force/displacement sensors 28 coupled between the proof mass 24 and the sensor frame 26 for measuring forces applied to the proof mass 24. The force/displacement sensors 28 are, for example, mechanical resonators formed from the active silicon layer 14 as double-ended tuning fork (DETF) force sensors. A known oscillator circuit, shown and described in above-incorporated U.S. Pat. No. 5,948,981, drives the mechanical resonators 28 at their resonance frequency. In response to an applied force, the proof mass 24 rotates about the hinge axis H, causing axial forces, either compressive or tensile, to be applied to the mechanical resonators 28. The axial forces change the frequency of vibration of the mechanical resonators 28, and the magnitude of this change serves as a measure of the applied force or acceleration. In other words, the force/displacement sensors 28 measure the applied acceleration force as a function of the displacement of the proof mass 24.

Undesirable external stresses and strains may be induced in the sensitive acceleration sensor mechanism 20 by, for example, mechanical coupling of the accelerometer sensor frame 26 to a silicon cover plate 30 which in turn is typically connected to a ceramic or metal mounting plate 32. Many methods are known for isolating the sensitive acceleration sensor mechanism 20 from such undesirable stresses and strains. Typically, the sensor frame 26 is suspended from a second outer or external frame portion 34 by flexures 36 formed by overlapping slots 38 and 40 through the substrate 12. The sensor frame 26 is thus able to move relative to the outer frame 34, as shown and described in U.S. Pat. No. 5,948,981, which is incorporated herein. Such isolation minimizes the distortion of the sensor frame 26, and thereby decreases the effects of external stresses and strains on the mechanical resonators 28.

FIG. 1B is a cross-section view taken through the accelerometer 10 along the resonators 28. As discussed above and shown in FIG. 1B, the proof mass 24 is free to rotate about the flexures 22 when subjected to acceleration along the input axis I according to the principle of Newton's law, F=ma. This rotation is constrained by the action of two force/displacement sensors 28, shown as DETF resonators, positioned on a surface of the mechanism as shown. These two vibrating beam force sensors 28 provide push-pull variable frequency output signals since, when the proof mass 24 is displaced relative to the plane of the sensor mechanism 20, one DETF resonator 28 is under compression while the other is under tension. The difference between the two frequencies represents the measured acceleration. Common mode frequency shifts, on the other hand, are rejected as errors driven by unwanted sources such as temperature, mechanism stress, or drift.

FIGS. 1A and 1B also illustrate the common over-constraint problem that arises due to the single proof mass 24 being constrained by two or more elements, in this case DETF resonators 28. The two DETF resonators 28 constrain not only the proof mass 24 common to each, but also impact each other through the common proof mass 24. Thus, any strains occurring in the sensor frame 26 are transmitted not only to the proof mass 24, but through the proof mass 24 to the other DETF resonator 28. Since the only significant compliance in the system is the sensing DETF resonators 28 themselves, almost the entire strain appears as an error output from the DETF resonators 28. Thus, undesirable errors are generated in the DETF resonators 28 from inputs having nothing to do with the acceleration being measured. These errors can be quite large since the compliance through the DETF resonators 28 must be low to detect acceleration with sufficient accuracy to be useful in practical systems.

FIG. 2 illustrates an accelerometer 40 having a common offset design of the prior art wherein the DETF resonators 28 are offset on either side of a proof mass 42 such that the two sensors operate in the push-pull mode described above. The offset DETF resonators 28 again constrain not only the proof mass 42 common to each, but also impact each other through the common proof mass 42. Furthermore, the offset DETF resonators 28 are again the only significant compliance in the system so that any strains occurring in the sensor frame 44 are transmitted to the proof mass 42 and through the proof mass 42 to the other DETF resonator 28, and almost the entire strain appears as an error output from the DETF resonators 28.

SUMMARY OF THE INVENTION

The present invention provides an apparatus and method that minimizes the over-constraint errors by providing an additional degree of freedom in the system, in contrast to the prior art devices and methods. The apparatus and method of the present invention thus provide improved performance from an accelerometer utilizing multiple force/displacement sensors in combination with a single proof mass. Since current known micromachining techniques can effectively produce the invention features in a substrate simultaneously with other accelerometer features, this improved performance comes at essentially no additional cost.

The apparatus and method of the present invention provides a suspension structure for suspending one or more force-versus-displacement sensors for measuring displacement of a pendular structure relative to a frame structure. The suspension structure includes a frame structure and a pendular structure, the pendular structure having a base structure suspended from the frame structure for rotation about a first axis, a beam structure spaced away from the first axis, and a flexure suspending the beam structure from the base structure for rotation about a second axis substantially perpendicular to the first axis.

According to one aspect of the invention, the flexure suspending the beam structure from the base structure further constrains the beam structure and substantially restrains the beam structure from rotation out of plane with the first axis.

According to another aspect of the invention, a center of mass of the beam structure is substantially colocated with the second axis of rotation.

According to another aspect of the invention, the beam structure includes mounting positions for force-versus-displacement sensors. The mounting positions are located at opposite ends of the beam structure in substantial alignment with a center of mass of the beam structure and offset from the first axis of rotation.

According to yet another aspect of the invention, the frame structure of the invention is embodied as an accelerometer, wherein force-versus-displacement sensors are coupled between the frame structure and respective positions on the beam structure that are located on opposite sides of the flexure that suspends the beam structure from the base structure.

According to still other aspects of the invention, a method is provided for resolving nonlinearities in an accelerometer, the method being formed of suspending a base portion of a proof mass for rotation about a first axis relative to a frame member; suspending a beam portion of a proof mass for rotation about a second axis relative to the base portion of the proof mass; and suspending a force-versus-displacement sensor between different positions on the frame member and each of two positions on the beam portion that are spaced apart on opposite sides of the second axis of rotation.

According to another aspect of the method of the invention, suspending a beam portion of a proof mass includes suspending the beam portion for rotation about a second axis that is substantially perpendicular to a plane containing the first axis.

Alternatively, the beam portion is further structured such that a center of mass thereof is substantially aligned with the second axis about which the beam portion rotates with respect to the base portion of the proof mass.

According to another aspect of the method of the invention, suspending a force-versus-displacement sensor includes suspending the force-versus-displacement sensor between the frame member and opposite ends of the beam portion.

According to still another aspect of the method of the invention, suspending a force-versus-displacement sensor alternatively includes suspending the force-versus-displacement sensor between the frame member and termination points on the beam portion that are substantially aligned with the second axis of rotation about which the beam portion rotates with respect to the base portion of the proof mass.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF PREFERRED EMBODIMENT

In the Figures, like numerals indicate like elements.

The present invention is an apparatus and method for suspending one or more force-versus-displacement sensors for measuring displacement of a pendular structure relative to a frame structure, wherein a suspension structure includes the frame and pendular structures, the pendular structure having a base structure suspended from the frame structure for rotation about a first axis, a beam structure spaced away from the first axis, and a flexure suspending the beam structure from the base structure for rotation about a second axis that is substantially perpendicular to the first axis. The flexure suspending the beam structure from the base structure is positioned substantially intermediate between suspension positions of the force-versus-displacement sensors, and constrains the beam structure to motion substantially within the plane of the pendular structure.

Figure 2:
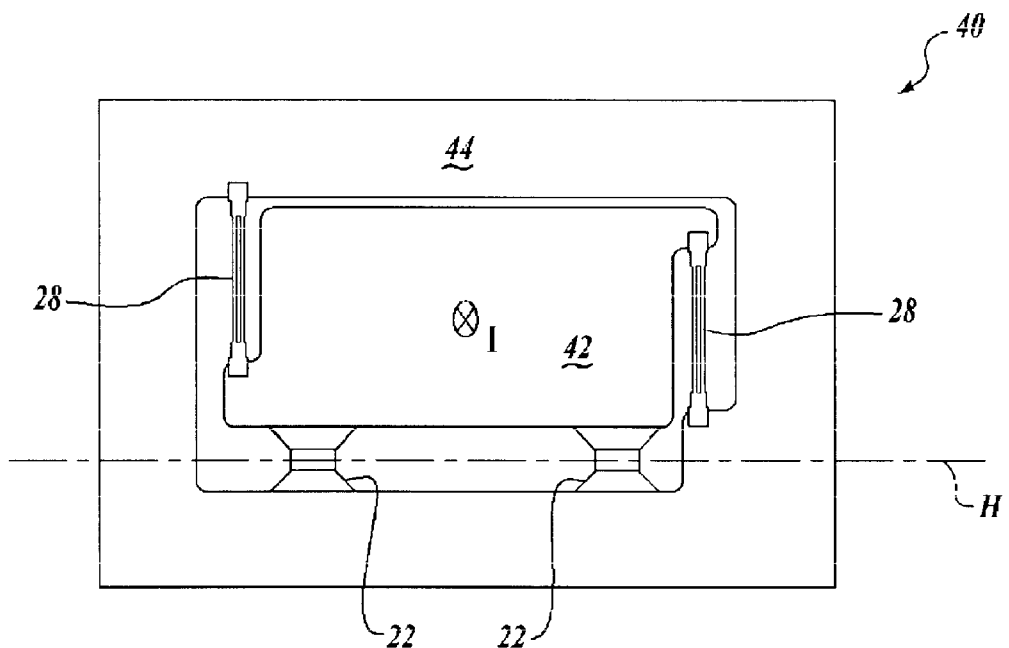
FIG. 2 is a plan view of a typical prior art two sensor/single proof mass accelerometer, commonly referred to as an offset design.
Figure 3:
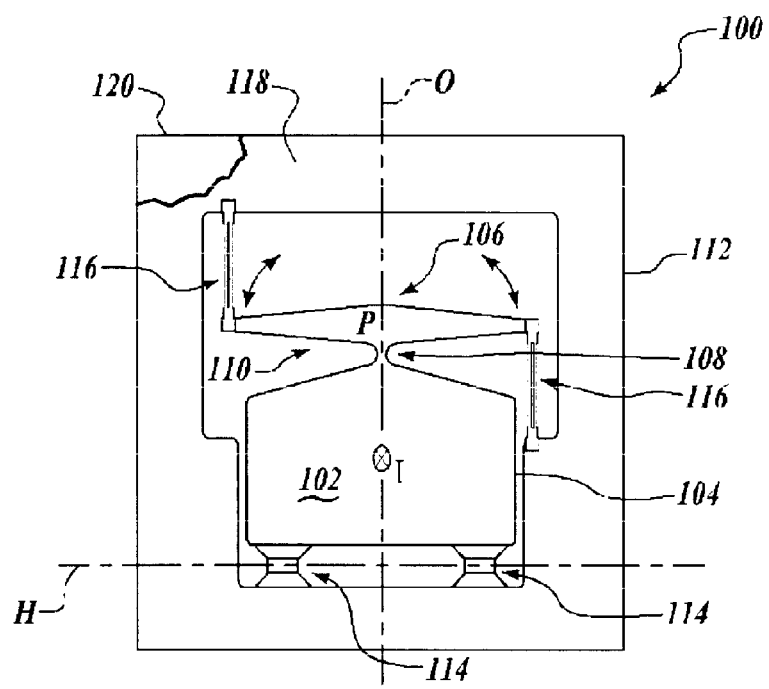
FIG. 3 is a plan view of the invention embodied as a whiffletree accelerometer of the invention that minimizes over-constraint errors.

FIG. 3 illustrates the frame structure and method of the invention that minimizes over-constraint errors embodied as an exemplary whiffletree accelerometer 100. According to the whiffletree accelerometer 100 embodied as shown in FIG. 3, a proof mass 102 is separated into two components, a base portion 104 and a whiffletree beam portion 106. These two components 104, 106 are connected by a whiffletree flexure or pivot 108 having a reduced cross-section in the plane defined by the input axis I and the output axis O, which is perpendicular to the hinge axis H. The whiffletree beam 106 and flexure 108 combine to form the whiffletree 110. The whiffletree flexure 108 has an associated spring constant that is a function of its thickness and length. The base portion 104 of the proof mass 102 is suspended from a sensor frame or plate 112 using typical accelerometer flexures 114, much the same as the proof mass 42 of the offset design shown in FIG. 2. Two force/displacement sensors 116 are suspended between the sensor frame 112 and opposite ends of the whiffletree beam 106. The force/displacement sensors 116 are, for example, mechanical resonators formed as double-ended tuning fork (DETF) force sensors from an active silicon layer 118 overlying a substrate 120, as described herein.

The flexures 114 allow the proof mass 102 to rotate freely about the hinge axis H that defines the sensitive axis of the accelerometer 100. Conversely, the whiffletree flexure 108 is structured to be compliant to rotation about the out-of-plane sensitive or input axis I normal to the proof mass 102, but is otherwise rigid to constrain the two components of the proof mass 102, the base portion 104 and the whiffletree beam portion 106, to a common plane. When subjected to acceleration along the sensitive axis of the accelerometer, i.e., the input axis I, the base 104 and the whiffletree 106 operate as one common proof mass 102. Under sensitive axis acceleration, this common proof mass 102 applies force to the combined restraint of the two force sensors 116 according to Newton's principle, F=ma. However, when the structure is subjected to strains that change the relative position of the two force sensors 116, the whiffletree beam portion 106 rotates slightly to relieve the strain.

In prior art designs, as discussed above, the two force sensors 116 are the only significantly compliant members of an otherwise rigid system. Thus, such strains act directly through the rigid mechanism to produce equivalent compression/tension of the two force sensors 116, and large errors result. According to the structure of the present invention, these errors are substantially reduced. The added rotational freedom provided by the whiffletree 110 permits a similar strain to be relieved through the high compliance of the whiffletree flexure 108 in combination with the whiffletree beam 106 length. Rotation of the whiffletree beam 106 is minimally resisted by the small spring constant of the whiffletree flexure 108. Thus, for a given mechanism strain, the whiffletree 110 reduces the resulting displacement and force generated at the two force sensors 116 by the ratio of the spring constant of the force sensors 116 to the spring constant of the whiffletree 110. This reduction of error forces generated at the two force sensors 116 may be several orders of magnitude.

Figure 1A:
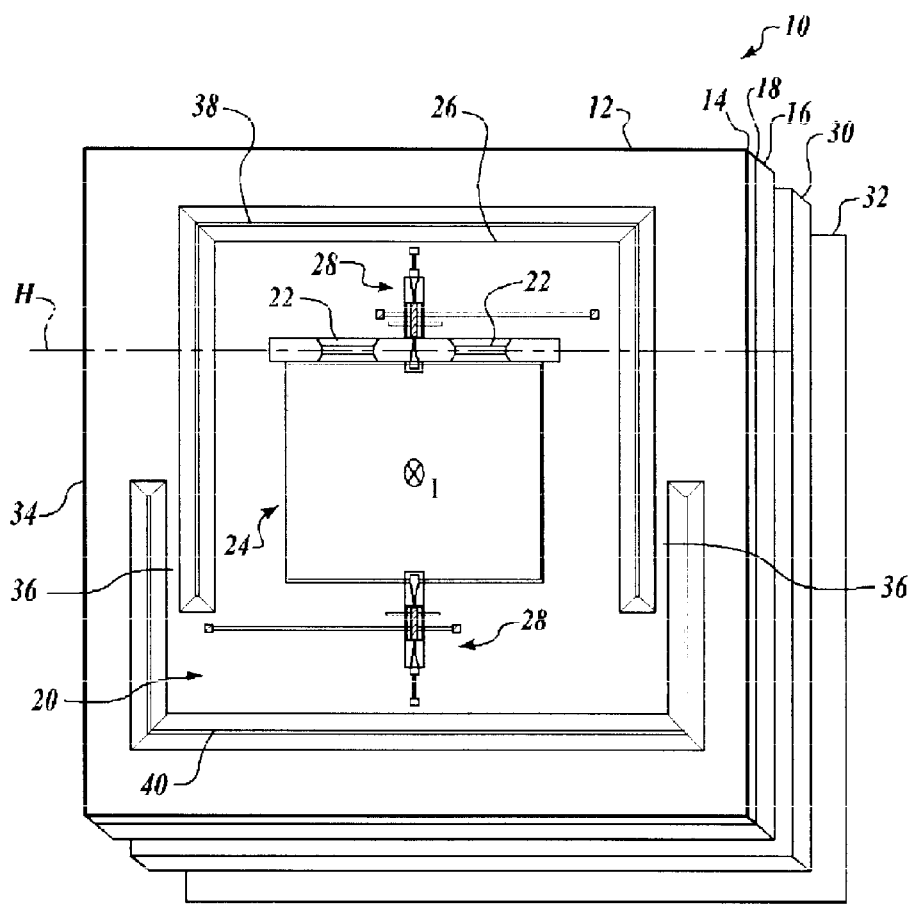
FIG. 1A is a plan view of a typical prior art two sensor/single proof mass accelerometer, commonly referred to as a Tee design.
Figure 1B:
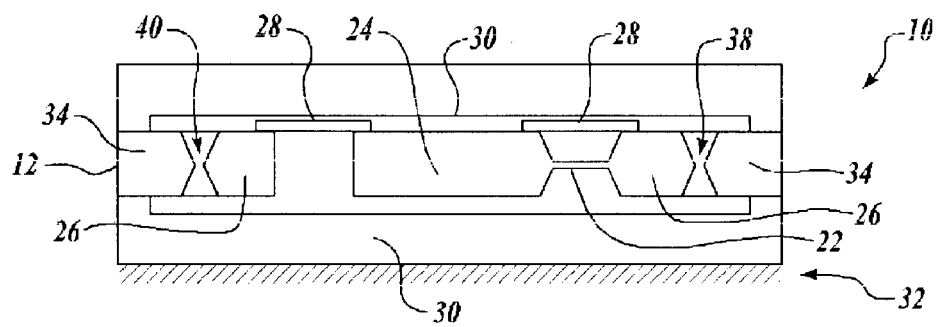
FIG. 1B is a cross-sectional view of the accelerometer illustrated in FIG. 1.

The whiffletree accelerometer 100 also resolves known nonlinearities that are also driven by the over-constraint of the systems shown in FIGS. 1 and 2. In the typical over-constrained systems of FIGS. 1 and 2, the over-constraint drives additional nonlinearities into the system as a function of the locations and dimensions of the various features. This can be somewhat useful in that a well-designed system can adjust these additional nonlinearities to balance against an inherent nonlinearity of the two force sensors, and thus achieve a null. However, these additional nonlinearities produced by the over-constraint may also result in added error sources that may impact either the modelability or the stability of the accelerometer. Since accelerometers of the type described herein are generally modeled in practical system applications, the added error sources may result in a greater limitation than the nonlinearity itself. This is particularly true in a push-pull system where the basic force sensor nonlinearity can be reduced or eliminated by common mode matching. The whiffletree 110 of the invention directly relieves the over-constraint and its related nonlinearities. Simple matching of the two force sensors to provide linearity performance is thus permitted.

Figure 4:
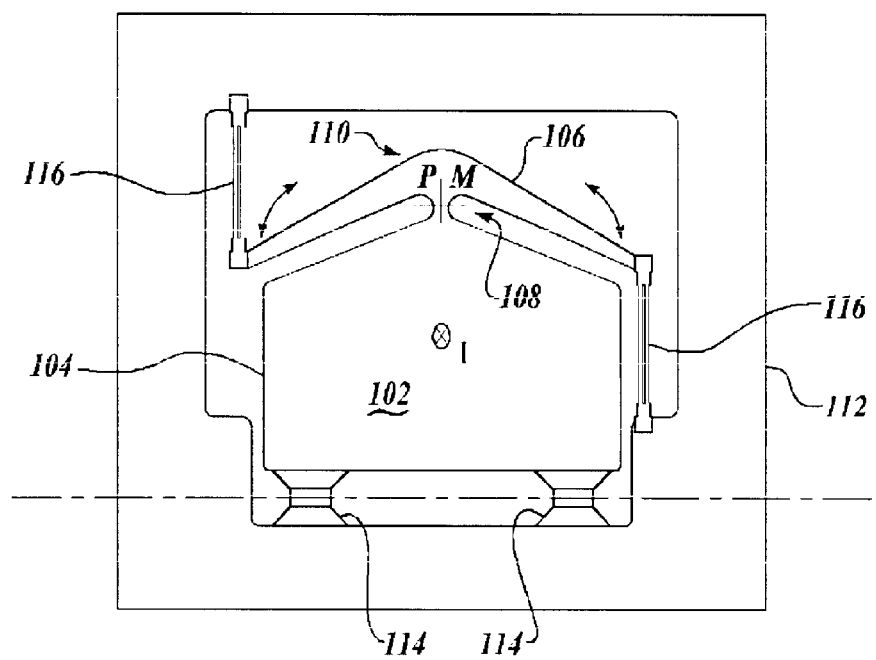
FIG. 4 is a plan view of another embodiment of the invention, wherein the shape of the whiffletree beam is structured to locate its center of mass coincidentally with the rotation point of the whiffletree flexure.

FIG. 4 illustrates another embodiment of the invention, wherein the shape of the whiffletree beam 106 is structured to locate its center of mass coincidentally with the rotation point on the pivot axis P of the whiffletree flexure 108. This coincidence of the center of mass and the rotation point eliminates the moment arm between the flexure pivot 108 and the beam 106 mass center that results in the embodiment shown in FIG. 3 from the offset distance between the whiffletree beam 106 and the pivot point of the whiffletree flexure 108. When the moment arm is eliminated as in the embodiment of FIG. 4, a cross-axis acceleration, i.e., an acceleration input along the hinge axis H, produces zero moment to be restrained by the two force sensors 116. Therefore, no corresponding error signal output is generated.

Figure 5:
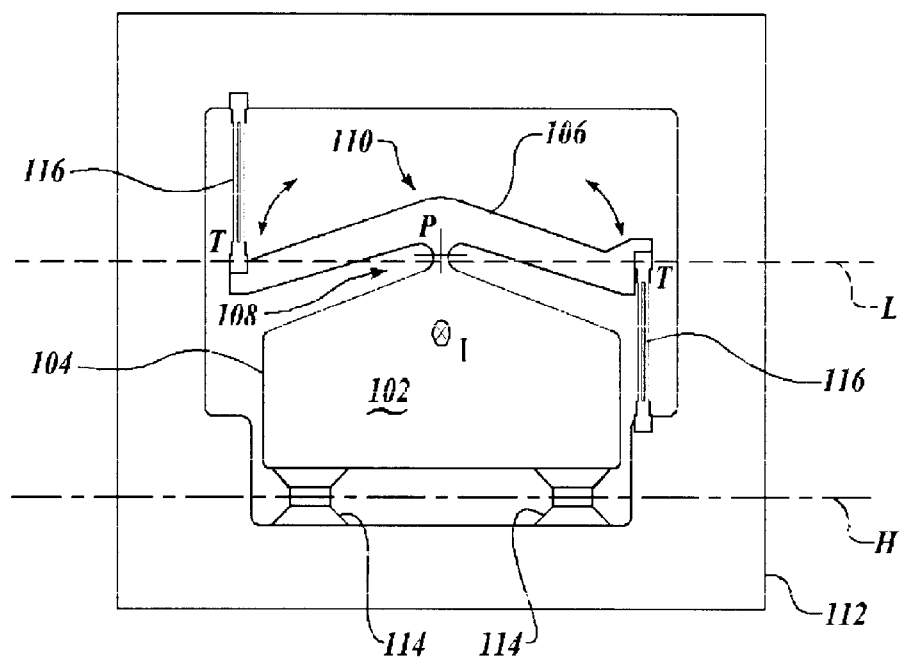
FIG. 5 is a plan view of another embodiment of the invention that minimizes sensitivity to out-of-plane bending strains around an axis parallel to the pivot axis of the whiffletree flexure.

FIG. 5 illustrates another embodiment of the invention that minimizes sensitivity to out-of-plane bending strains around an axis parallel to the pivot axis of the whiffletree flexure 108. Accordingly, termination points T of the two force sensors 116 are deliberately aligned with a line L that is parallel to the pivot axis H of the proof mass flexures 114 to minimize differential displacements due to bending.

According to another alternative embodiment of the invention, the whiffletree flexure 108 is a torsional flexure structured to rotate about the pendulous or output axis O when the two force sensors 116 are mounted out of plane. Given current in-plane silicon fabrication technology, this torsional flexure embodiment is difficult to implement in systems utilizing force sensors 116 embodied as DETFs but is useful for systems utilizing non-DETF sensors and may become more useful as silicon fabrication alternatives become available.

Other alternative embodiments of the whiffletree invention are also contemplated. For example, the whiffletree 110 is alternatively located in the sensor frame 112 instead of being part of the proof mass assembly 102. Therefore, while the preferred embodiment of the invention has been illustrated and described, it will be appreciated that various changes can be made therein without departing from the spirit and scope of the invention.

What is claimed is:

1. An apparatus, comprising:
   a proof mass having a base portion suspended for rotation relative to a frame and a beam portion suspended for rotation relative to the base portion substantially within a plane common with the base portion;
   two force-versus-displacement sensors suspended to operate in a push-pull mode between the frame and portions of the beam portion that are oppositely positioned relative to a suspension member coupled between the base portion and the beam portion.

2. The apparatus of claim 1 wherein the suspension member coupled between the base portion and the beam portion is further structured to constrain the beam portion to rotation substantially within the common plane.

3. The apparatus of claim 1 wherein the beam portion is spaced away from a portion of the base portion that is suspended from the frame.

4. The apparatus of claim 1 wherein the beam portion is structured having a center of mass located substantially coincidentally with a rotation point relative to the base portion.

5. The apparatus of claim 1 wherein each of the two force-versus-displacement sensors is coupled to the beam portion of the proof mass substantially in alignment with an axis of rotation of the beam portion of the proof mass relative to the base portion.

6. An accelerometer, comprising:
   a frame formed in a substantially planar substrate;
   a substantially planar proof mass formed in the substrate and having a first base portion suspended from the frame by one or more first flexures and a whifflebeam portion suspended from the first base portion by a second flexure for rotation about an axis substantially normal to the plane of the proof mass; and
   first and second force-versus-displacement sensors suspended to operate in a push-pull mode between the frame and the whifflebeam portion of the proof mass on opposite sides of the second flexure.

7. The accelerometer of claim 6 wherein the second flexure is positioned substantially intermediate between first and second suspension positions of the respective first and second force-versus-displacement sensors on the whifflebeam portion of the proof mass.

8. The accelerometer of claim 6 wherein the second flexure constrains the whifflebeam portion to motion substantially within the plane of the proof mass.

9. The accelerometer of claim 6 wherein a center of mass of the whifflebeam portion of the proof mass substantially coincides with a center of rotation of the second flexure which suspends the whifflebeam portion of the proof mass.

10. The accelerometer of claim 6 wherein first and second ends of the whifflebeam portion whereat the first and second force-versus-displacement sensors are suspended are both substantially aligned with the axis of rotation of the second flexure at a position spaced substantially equidistantly from an axis of rotation of the one or more first flexures by which the first base portion is suspended from the frame.

11. A suspension structure for suspending one or more force-versus-displacement sensors for measuring displacement of a pendular structure relative to a frame structure, the suspension structure comprising:
    a frame structure; and
    a pendular structure comprising:
       a base structure suspended from the frame structure for rotation about a first axis,
       a beam structure spaced away from the first axis, and
       a suspension means for suspending the beam structure from the base structure for rotation about a second axis that is oriented substantially perpendicularly to the first axis.

12. The frame structure of claim 11 wherein the means for suspending the beam structure from the base structure further substantially restrains the beam structure from rotation out of plane with the first axis.

13. The frame structure of claim 11, further comprising mounting positions for force-versus-displacement sensors that are located at opposite ends of the beam structure in substantial alignment with a center of mass of the beam structure and offset from the first axis of rotation.

14. The frame structure of claim 11 wherein a center of mass of the beam structure is substantially colocated with the second axis of rotation.

15. The frame structure of claim 11, further comprising force-versus-displacement sensors coupled between the frame structure and respective positions on the beam structure located on opposite sides of the means for suspending the beam structure from the base structure.

16. A method for resolving nonlinearities in an accelerometer, the method comprising:
    suspending a base portion of a proof mass for rotation about a first axis relative to a frame member;
    suspending a beam portion of a proof mass for rotation about a second axis relative to the base portion of the proof mass; and
    suspending means for measuring force versus displacement between different positions on the frame member and each of two positions on the beam portion that are spaced apart on opposite sides of the second axis of rotation.

17. The method of claim 16 wherein suspending a beam portion of a proof mass further comprises suspending the beam portion for rotation about a second axis that is substantially perpendicular to a plane containing the first axis.

18. The method of claim 17 wherein the beam portion is further structured such that a center of mass thereof is substantially aligned with the second axis about which the beam portion rotates.

19. The method of claim 16 wherein suspending means for measuring force versus displacement further comprises suspending the measuring means between the frame member and opposite ends of the beam portion.

20. The method of claim 16 wherein suspending means for measuring force versus displacement further comprises suspending the measuring means between the frame member and termination points on the beam portion that are substantially aligned with the second axis of rotation.

* * * * *